(12) United States Patent
Miyata

(10) Patent No.: US 9,812,625 B2
(45) Date of Patent: Nov. 7, 2017

(54) LIGHT-EMITTING DEVICE HAVING RESIN MEMBER WITH CONDUCTIVE PARTICLES

(71) Applicant: Nichia Corporation, Anan-shi (JP)

(72) Inventor: Tadaaki Miyata, Yokohama (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/625,167

(22) Filed: Feb. 18, 2015

(65) Prior Publication Data
US 2015/0236230 A1 Aug. 20, 2015

(30) Foreign Application Priority Data

Feb. 18, 2014 (JP) .................................. 2014-028310
Apr. 23, 2014 (JP) .................................. 2014-089145

(51) Int. Cl.
*H01L 33/62* (2010.01)
*H01L 33/00* (2010.01)
*H01L 33/48* (2010.01)

(52) U.S. Cl.
CPC .......... *H01L 33/62* (2013.01); *H01L 33/0095* (2013.01); *H01L 33/48* (2013.01); *H01L 2224/16225* (2013.01); *H01L 2224/32225* (2013.01); *H01L 2224/73204* (2013.01); *H01L 2924/181* (2013.01); *H01L 2933/0033* (2013.01); *H01L 2933/0066* (2013.01)

(58) Field of Classification Search
CPC .......... H01L 33/62; H01L 2224/73204; H01L 33/60; H01L 2924/18161
See application file for complete search history.

(56) References Cited

U.S. PATENT DOCUMENTS

| 2005/0116235 | A1  | 6/2005  | Schultz et al. |
| 2013/0001618 | A1* | 1/2013  | Imai ............... H01L 33/486 257/98 |
| 2013/0087825 | A1  | 4/2013  | Umakoshi et al. |
| 2013/0105841 | A1* | 5/2013  | Namiki ............ H01L 33/60 257/98 |
| 2013/0199824 | A1* | 8/2013  | Lee ................. H05K 3/323 174/251 |
| 2013/0264602 | A1  | 10/2013 | Namiki et al. |

(Continued)

FOREIGN PATENT DOCUMENTS

| JP | 07-142780 A | 6/1995 |
| JP | 08-340022 A | 12/1996 |

(Continued)

*Primary Examiner* — Thao X Le
*Assistant Examiner* — J. R. Oakley
(74) *Attorney, Agent, or Firm* — Foley & Lardner LLP

(57) ABSTRACT

A light-emitting device includes a support including a substrate, a pair of electrodes and an insulating reflective member, the pair of electrodes being disposed on an upper surface of the substrate, and the reflective member being disposed on the substrate, a light-emitting element flip-chip mounted on the pair of electrodes, and a resin member disposed at least between the light-emitting element and the reflective member, the resin member including a conductive substance which electrically connects the light-emitting element to the pair of electrodes, the reflective member being disposed at least over an entirety of a surface that is located immediately below the resin member.

19 Claims, 5 Drawing Sheets

(56) References Cited

U.S. PATENT DOCUMENTS

| | | | |
|---|---|---|---|
| 2014/0014992 A1* | 1/2014 | Tsuchiya | H01L 33/60 257/98 |
| 2015/0054008 A1* | 2/2015 | Rhee | H01L 25/0753 257/89 |

FOREIGN PATENT DOCUMENTS

| | | |
|---|---|---|
| JP | 09-008360 A | 1/1997 |
| JP | 10-277774 A | 10/1998 |
| JP | 10-308121 A | 11/1998 |
| JP | 11-168235 A | 6/1999 |
| JP | 2000-306428 A | 11/2000 |
| JP | 2003-209286 A | 7/2003 |
| JP | 2005-123657 A | 5/2005 |
| JP | 2006-086104 A | 3/2006 |
| JP | 2006-102816 A | 4/2006 |
| JP | 2007-513520 A | 5/2007 |
| JP | 2011-222830 A | 4/2011 |
| JP | 2012-156214 A | 8/2012 |
| JP | 2012-186322 A | 9/2012 |
| JP | 2012-207216 A | 10/2012 |
| JP | 2013-045650 A | 3/2013 |
| JP | 2014-003242 A | 1/2014 |

* cited by examiner

LIGHT-EMITTING DEVICE HAVING RESIN MEMBER WITH CONDUCTIVE PARTICLES

CROSS-REFERENCE TO RELATED APPLICATIONS

This application claims priority to Japanese Patent Application No. 2014-028310 filed on Feb. 18, 2014, and Japanese Patent Application No. 2014-089145 filed on Apr. 23, 2014, the disclosures of which are hereby incorporated herein by reference in their entireties.

BACKGROUND

Technical Field

The present disclosure relates to light-emitting devices and processes for manufacturing such light-emitting devices.

Description of the Related Art

A flip-chip connection technique using an anisotropic conductive film (ACF) is a conventional method for connecting a light-emitting element to a substrate (See JP09-8360A.). The ACF is a resin film in which conductive particles are dispersed. After being arranged between a light-emitting element and a substrate, the film is heated while a pressure is applied to the light-emitting element and the substrate so that the conductive particles are caught between electrodes of the light-emitting element and electrodes of the substrate. In this manner, an electrical connection is established by the conductive particles and at the same time the light-emitting element and the substrate are strongly bonded to each other.

Also, a connection technique using an anisotropic conductive paste (ACP) has been developed (See JP09-008360A and JP11-168235A.). The ACP is a dispersion of conductive particles in an adhesive such as an epoxy thermosetting resin. The ACP is applied to a substrate, and a light-emitting element is thermocompression bonded (usually before the curing of the ACP) to the ACP coat. Thus, the light-emitting element is fixed on the substrate and, similarly to the case of the ACF, the conductive particles are caught between electrodes of the light-emitting element and electrodes of the substrate to establish an electrical connection. By using ACP for flip-chip mounting bonding, the post step in the flip chip mounting in which an underfill material is applied to fill spaces such as gaps between a light-emitting element and a substrate can be eliminated.

The conductive particles in the ACFs or the ACPs tend to absorb part of the light emitted from the light-emitting element. To enhance the light extraction efficiency by reflecting the light emitted from the light-emitting element toward the ACF or the ACP, it is proposed that a light-reflecting layer is disposed on the surface of the light-emitting element on the substrate side (See JP11-168235A) or that light-reflective and insulating particles such as titanium oxide, silicon oxide, barium sulfate, boron nitride, zinc oxide or aluminum oxide are added to the ACFs or the ACPs themselves to impart a light-reflecting function (See JP2012-186322A).

An ESC method is a connection method analogous to the flip chip connection techniques with ACPs or ACFs. This method uses an adhesive containing solder particles as conductive particles, and an electronic element and a substrate are soldered to each other via the solder particles caught at the joints between bumps deposited on electrodes of the electronic element and electrodes disposed on the substrate (See JP2013-45650A).

JP2012-156214A discloses a light-emitting device which includes a light-emitting element that is flip-chip mounted on a substrate having a wiring, the light-emitting device being characterized in that it has an insulating light-reflecting layer disposed on the wiring and has a bump which penetrates through the insulating light-reflecting layer to reach the wiring and thereby connects the light-emitting element to the wiring.

SUMMARY

In the ACP connection technique or the ESC technique, electrodes (on the substrate side) are exposed and opposed to a light-emitting element that is connected thereto. There is a risk that the light extraction efficiency of light-emitting devices may be decreased by the absorption of light by such exposed portions of the electrodes. It is therefore an object of certain embodiments of the invention to provide a light-emitting device that is manufactured by a connection method such as the ACP connection technique or the ESC method so as to prevent a decrease in light extraction efficiency due to light absorption and thereby to achieve good light extraction efficiency.

In the ACP connection technique and the ESC method, a light-emitting element is mounted on a substrate by the simultaneous application of heat and pressure. To ensure that the light-emitting element is firmly bonded (fixed) onto the substrate, it is necessary that an adhesive layer be provided in a greater (larger) area than the light-emitting element and in a certain degree of thickness.

Here, due to its flowability, at least a portion of the adhesive is squeezed out by the lower surface of the light-emitting element during mounting and moves upward on the side surface of the light-emitting element by exhibiting wetting properties, thus forming a fillet covering a portion of the side surface.

The adhesive contains conductive particles, and the conductive particles can absorb light emitted from the light-emitting element. Although the amount of the adhesive forming such a fillet is small, a certain amount of the conductive particles are present in the fillet.

According to one embodiment of the invention, a light-emitting device includes a support including a substrate, a pair of electrodes and an insulating reflective member, the pair of electrodes being disposed on an upper surface of the substrate, and the reflective member being disposed on the substrate, a light-emitting element flip-chip mounted on the pair of electrodes, and a resin member disposed at least between the light-emitting element and the reflective member, the resin member including a conductive substance which electrically connects the light-emitting element to the pair of electrodes, the reflective member being disposed at least over an entirety of a surface that is located immediately below the resin member.

According to one of the aspects of the invention, there is provided a light-emitting device that is manufactured by a connection method such as the ACP connection technique or the ESC method so as to prevent the occurrence of light absorption and thereby to achieve good light extraction efficiency.

DETAILED DESCRIPTION

Hereinbelow, light-emitting devices according to embodiments will be described in detail with reference to the drawings. Specific embodiments indicated below as required are only illustrative for the purpose of giving concrete forms to the technical ideas of the invention, and the scope of the invention is not limited to such embodiments. Further, the configurations described below such as the sizes, the materials, the shapes and the relative positions of constituent parts are only illustrative unless otherwise mentioned and do not intend to limit the scope of the invention thereto.

As used in the present specification, the term "on" such as in referring to layers may indicate not only that a layer is formed in direct contact with the upper surface of an underlying layer but also that there is a space or an intermediate layer between these layers.

First, the configuration and the like of the light-emitting devices of the first aspect will be described based on first and second embodiments.

[Light-Emitting Device]

Figure 1:
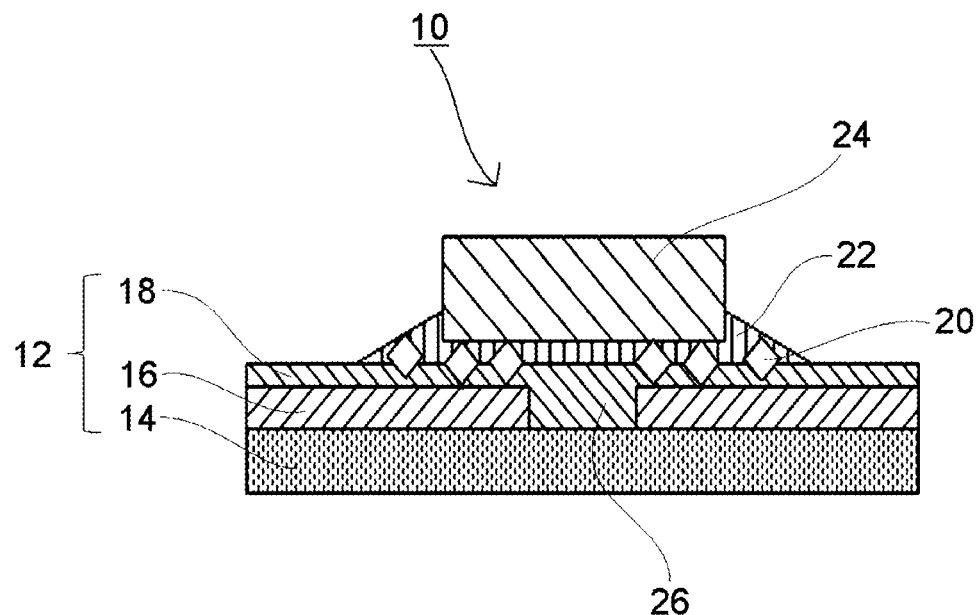
FIG. 1 is a schematic view illustrating a cross section of a light-emitting device according to the first embodiment.

FIG. 1 is a schematic view illustrating a cross section of a light-emitting device according to the first embodiment. Hereinbelow, a light-emitting device 10 according to the first embodiment will be described with reference to FIG. 1.

<Support 12>

The light-emitting device 10 of the present embodiment includes a support 12 which includes a substrate 14, a pair of electrodes 16 on an upper surface of the substrate 14, and an insulating reflective member 18. The substrate 14 in the support 12 is a member serving as the base of the support 12, and may be formed of an appropriate material selected from various known materials in accordance with needs such as the purpose and the application and also in light of factors such as the mounting of a light-emitting element 24 described later, the optical reflectance and the adhesion with respect to other members. Examples of the materials include ceramics, resins and glasses.

Examples of the ceramics include aluminum nitride, alumina and low-temperature Co-fired ceramics (LTCC).

Examples of the resins include thermosetting resins and thermoplastic resins. Specific examples of the resins include epoxy resins, silicone resins, modified epoxy resins such as silicone-modified epoxy resins, modified silicone resins such as epoxy-modified silicone resins, polyimide resins, modified polyimide resins, urethane resins, modified urethane resins, Teflon (registered trademark), FR-4 and CEM-3. Examples further include polyethylene terephthalates (PET), polyethylene naphthalates (PEN), liquid crystal polymers and nylons. The resins may contain fine particles of titanium oxide, silicon oxide, aluminum oxide, magnesium oxide, magnesium carbonate, calcium carbonate, magnesium hydroxide, calcium hydroxide and the like.

The substrate 14 can be formed of the aforementioned various known materials, and the use of a flexible material, for example, a polyethylene terephthalate, a polyimide resin or a liquid crystal polymer, can produce a flexible substrate 14. When, in particular, a solder material is used in the mounting of a light-emitting element 24, it is preferable to use a polyimide resin having high heat resistance. The use of a flexible substrate 14 made of such a material, in combination with the selection of appropriate materials for other members disposed on the substrate such as the electrodes 16, the reflective member 18 and a resin member 22 described later, makes it possible to manufacture a light-emitting device 10 exhibiting flexibility. Such light-emitting devices 10 have advantages such as the ability of being installed in irregular locations and thus realize a higher degree of freedom in the designs of products including the light-emitting devices 10.

To enhance the light extraction efficiency of the light-emitting device 10, a material having a high optical reflectance (for example, a white filler such as titanium oxide) may be added to the material used to form the substrate 14. The thickness of the substrate 14 may be any value that is commonly used in the art without limitation and may be, for example, about 10 µm to several millimeters (mm) In the case of a flexible substrate 14, the thickness of the substrate 14 may be, for example, about 10 µm to 100 µm.

The shape of the substrate 14 as seen from above is not particularly limited and may be any of various shapes such as quadrangular shapes, rectangular shapes, polygonal shapes, circular shapes, ellipsoidal shapes and combinations of any of these shapes. When the light-emitting device 10 is used in applications such as straight tube fluorescent lamps, the substrate 14 is preferably a rectangle having a length that is 10 or more times greater than the width in the shorter direction. When, for example, the light-emitting device 10 is used in a straight tube lamp having a length of about 120 centimeters (cm), the substrate 14 may be 0.5 cm to 5 cm in width and 30 cm to 120 cm in length.

<Electrodes 16>

In the support 12, a pair of electrodes 16 is disposed on the substrate 14. A light-emitting element 24 will be flip-chip mounted on the electrodes 16. The substrate 14 has at least a pair of electrodes 16, and may have three or more electrodes.

The electrodes 16 may be formed in the form of metal wiring or lead frames. When the light-emitting device 10 is a frame insert type, the electrodes 16 may be lead plates processed into desired shapes. As will be described later, the electrodes 16 are disposed on the substrate 14 such that a light-emitting element 24 may be electrically connected thereto. As long as this connection is established, the shapes of the electrodes may be flat, may be irregular in thickness, or may be curved in an upward or downward direction. The configuration such as the thickness and the shape of the electrodes may be variable and appropriately selected in accordance with factors such as the shape of the light-emitting device 10.

Preferred examples of the materials for the electrodes 16 include Fe, Cu, Ni, Al, Ag, Au, metals (alloys) and platings containing these metals, and stacks of these metal materials. The materials are selected appropriately in accordance with factors such as electrical conductivity, heat radiation properties, and the adhesion with respect to other members such as the substrate 14 and the reflective member 18. In the first embodiment, the electrodes 16 under the light-emitting element 24 are covered with the reflective member 18. With this configuration, even materials having a low reflectance may be used as the electrodes.

The thickness of the electrodes 16 may be any value that is commonly used in the art without limitation and may be, for example, about several micrometers (μm) to several millimeters (mm). In particular, in case where a light-emitting device having flexibility is to be manufactured using a flexible substrate 14, the thickness of the electrodes 16 is preferably such that the flexibility of the substrate is not impaired, and may be, for example, about 5 μm to 150 μm.

In case where the electrodes 16 are metal wirings, the configuration such as the shape thereof as seen from above is not particularly limited and may be the same as or similar to the shape of usual wiring patterns disposed on substrates or the like on which light-emitting elements are mounted. The configuration such as the shape of the electrodes is preferably determined in consideration of factors such as heat radiation properties and/or strength. Examples of such shapes include crank shapes, polygonal shapes such as triangular shapes and quadrangular shapes, round shapes such as circles and ellipses, any of these shapes having local irregularities, and combinations of any of these shapes. The electrodes 16 are disposed to cover 75% or more, preferably 80% or more, and more preferably 90% or more of the surface of the substrate 14 on which a light-emitting element is mounted. With this configuration, the heat radiation properties of the light-emitting device 10 may be enhanced.

Preferably, the electrodes 16 discussed above are a pair of positive and negative metal wiring electrodes that are stacked on the substrate 14 while being spaced apart from each other. This configuration enhances the degree of freedom in the shapes of the electrodes 16. For example, a plurality of metal wirings as the electrodes 16 may be provided on the substrate 14 over a large area, and thereby the heat radiation properties of the light-emitting device 10 may be enhanced.

<Reflective Member 18>

In the light-emitting device 10 of the present embodiment, the support 12 has an insulating reflective member 18 on the upper surface of the substrate 14. The reflective member 18 is disposed at least over the entire surface immediately below a resin member 22 described later. In other words, in a top view of the light-emitting device 10, the resin member 22 is disposed on a portion or the entirety of the upper surface of the reflective member 18.

The resin member 22 contains an insulating resin and a conductive substance 20 used in the ACP connection technique or the ESC method. The function of this member is to place and mount a light-emitting element 24 onto the substrate 14 by the curing of an ACP coating or an adhesive by the simultaneous application of heat and pressure.

The conductive substance 20 in the resin member 22 may possibly decrease the light extraction efficiency of the light-emitting device by absorbing the light emitted from the light-emitting element 24. In the present embodiment, however, the reflective member 18 disposed at least over an entirety of a surface that is located immediately below the resin member 22 efficiently reflects the downward light emitted from the light-emitting element 24, thereby suppressing the adverse effect on the light extraction efficiency due to the light absorption.

As used in the present specification, the meaning of "an entirety of a surface that is located immediately below the resin member 22" is not limited to the perfect entire surface, and a slight void, clearance or whatsoever may be present in the reflective member 18 as long as the extension of the reflective member 18 may be equated with a continuation over the entire surface and also as long as the advantageous effects of the first embodiment may be obtained. As will be described later, the reflective member 18 is penetrated by the conductive substance 20 in the resin member 22. Even in this case, the reflective member 18 is regarded as being disposed over an entirety of a surface that is located immediately below the resin member 22. That is, the present specification describes the reflective member 18 as being disposed over an entirety of a surface that is located immediately below the resin member 22 even in the case where the reflective member 18 is present over the entirety of the surface that is located immediately below the resin member 22 except for the portions of the conductive substances 20 that electrically connect the light-emitting element 24 to the electrodes 16.

Preferably, the reflective member 18 is formed such that the upper surface of the reflective member 18 is substantially flat (substantially parallel with the upper surface of the substrate 14). This configuration eliminates any level difference which causes the liquid resin member 22 to pool during the formation of the resin member 22 on the reflective member as described later, and thus makes it possible to form the resin member 22 with a small thickness throughout the entirety thereof. During the flip-chip mounting of a light-emitting element 24 described later, at least a portion of the resin member 22 is squeezed out by the pressure applied and moves upward on the side surface of the light-emitting element 24 to form a fillet. Here, the above configuration which allows the resin member 22 to be formed in a small thickness can decrease the size of the fillet.

In particular, as mentioned earlier, the electrodes 16 may be a pair of spaced apart metal wirings stacked on the substrate 14. In case where a configuration is adopted in which the resin member 22 is disposed to fill a gap 26 defined between the pair of metal wirings and a light-emitting element 24 is mounted on the region, a large amount of the resin member 22 should be applied to the gap 26 and consequently a large fillet will be formed on the side surface of the light-emitting element 24 above the gap 26. An increase in the size of a fillet increases the amount of the conductive substance 20 located on the side surface of the light-emitting element 24. As mentioned earlier, the conductive substance 20 may absorb light and may cause a decrease in light extraction efficiency. A possible approach to prevent this problem is to form the resin member 22 with a small thickness over the entire surface of the metal wirings including the gap 26. Considering, however, that the pair of electrodes 16 on the substrate 14 and also the electrodes on the light-emitting element 24 have a certain thickness, it is technically difficult to form the resin member 22 with a small thickness. Even if a thin resin member is formed, a void may remain in the gap 26 possibly to cause a decrease in the mechanical strength of the light-emitting device 10.

Regarding this problem, the reflective member 18 can be formed over the metal wirings (the electrodes 16) including the gap 26, and the resin member 22 is formed on the reflective member 18. This configuration makes it possible to reflect the downward light emitted from the light-emitting element 24 and also to suppress the formation of a large fillet, and consequently the light extraction efficiency of the light-emitting device 10 may be enhanced. Because the reflective member 18 has insulating properties, the gap 26 may be filled with the reflective member 18 to ensure that problems such as undesired conduction between the pair of electrodes 16 on the substrate 14 may be sufficiently prevented.

By providing the above reflective member 18, it becomes possible to form the resin member 22 with a small thickness, namely, to reduce the amount of the resin member 22 used. Thus, the above configuration is advantageous also in terms of the cost for manufacturing the light-emitting device 10.

Even if the upper surface of the reflective member 18 is not flat, advantages may be still obtained by the configuration in which the reflective member 18 is formed at least over an entirety of a surface that is located immediately below the resin member 22, specifically, at least portions of the upper surface of the pair of electrodes 16 extending to a periphery of the light-emitting element 24, and also the entire region of the gap 26. That is, according to such a configuration, the formation of a fillet may be suppressed and the light extraction efficiency of the light-emitting device 10 may be enhanced. Because the reflective member 18 is formed over the entirety of the specific region, there is no need to adopt an expensive process such as pattern printing. That is, the reflective member 18 may be formed by a simple method such as full printing, application or spin coating, and thus the manufacturing cost may be reduced.

As a result of at least portions of the electrodes 16 and the gap 26 being covered with an identical material, namely, the reflective member 18, uniform wettability is exhibited over the location where the resin member 22 is formed, and consequently the formation of a fillet is effectively suppressed.

The shape of the reflective member 18 in a top view of the light-emitting device 10 is not particularly limited as long as the reflective member 18 is disposed at least over an entirety of a surface that is located immediately below the resin member 22. Various shapes may be used, with examples including quadrangular shapes, rectangular shapes, polygonal shapes, circular shapes, ellipsoidal shapes and combinations of any of these shapes. Because the substrate 14 and the pair of electrodes 16 disposed thereon have a lower optical reflectance than the reflective member 18, the reflective member 18 is advantageously formed so as to cover portions of the exposed surfaces of the electrodes 16 and the substrate 14 which extend at least to a periphery of the light-emitting element 24, and more preferably to cover the entirety of the exposed surfaces of the electrodes 16 and the substrate 14, thereby enhancing the light extraction efficiency of the light-emitting device 10. Covering the entirety of the exposed surface of the electrodes 16 with the reflective member 18 may make it difficult to recognize the place on which the light-emitting element 24 should be mounted. In such a case, the reflective member 18 may be separately provided with a recognition pattern such as a notch or a hole.

The reflective member 18 described above is formed using a known material which has a higher optical reflectance than the resin member 22. Specifically, for example, the reflective member 18 may be formed of such a material as a white resin or a white resist. Further, it is preferable to form the reflective member 18 using a material which exhibits high adhesion with the resin member 22. Examples of such materials include mixtures of light-transmissive resins with light-reflecting materials. Specifically, suitable materials are mixtures of epoxy resins or silicone resins with light-reflecting materials such as titanium oxide, zinc oxide, silicon oxide and zirconium oxide.

The thickness of the reflective member 18 is not particularly limited, but is usually in the range of 1 µm to 100 µm, and preferably 1 µm to 10 µm. The thickness of the reflective member 18 is the thickness of a portion of the reflective member 18 between the electrode 16 on the substrate 14 and the light-emitting element 24. Referring to FIG. 1, the thickness is the distance from the upper surface of the electrode 16 to the upper surface of the reflective member 18.

<Resin Member 22>

In the light-emitting device 10, the light-emitting element 24 is flip-chip mounted on the pair of electrodes 16 in the support 12. The resin member 22 is responsible for the bonding and the electrical conduction between the electrodes 16 and the light-emitting element 24 mounted thereon. Specifically, the resin member 22 is disposed at least between the light-emitting element 24 and the substrate 14. More specifically, the resin member 22 is disposed at least over an entirety of a surface that is located immediately below the light-emitting element 24 and between the substrate 14 and the light-emitting element 24. With the resin member 22 disposed in this manner, the light-emitting element 24 is firmly bonded to the support 12. Because the resin member 22 does not have good light-reflecting properties and can absorb light, it is preferable that the resin member 22 be not formed over an excessively large area extending beyond the entire surface immediately below the light-emitting element 24.

The resin member 22 contains a conductive substance 20, more specifically, conductive particles and/or a solder material. The conductive substance 20 is caught between the electrodes 16 and the light-emitting element 24 to be in contact with these components. Consequently, the electrodes 16 of the support 12 are electrically connected to electrodes of the light-emitting element 24 (not shown in FIG. 1) via the conductive substance 20. To ensure this contact, it is preferred that the average particle diameter of the conductive substance 20 is larger than the thickness of the reflective member 18.

If, for example, the particles of the conductive substance 20 are arranged continuously in a lateral direction in FIG. 1, a short circuit will be caused between the pair of electrodes 16. To prevent such problems, the resin member 22 contains the conductive substance 20 in a controlled amount.

The conductive particles as the conductive substance 20 may be any of various metal particles used as conventional conductive particles for anisotropic conductive connection (such as the ACP connection technique). Examples thereof include gold, nickel, copper, silver, palladium, aluminum, titanium, zirconium, hafnium, chromium, molybdenum, tungsten, alloys of these metals, and stacks of these metal materials (such as nickel plating/gold flash plating).

The conductive particles may be metal-coated resin particles obtained by coating resin particles with any of the aforementioned metal materials. Examples of the resin particles include styrene resin particles, benzoguanamine resin particles and nylon resin particles. The resin particles may be coated with the metal materials by known methods such as electroless plating methods and electrolytic plating methods. The coating thickness of the metal materials is variable depending on the particle diameters of the resin particles and the types of the metals, but should be enough to ensure good connection reliability. The coating thickness may be 0.01 to 3 µm.

The solder material (the ESC method) as the conductive substance 20 may be a low-melting material including at least one metal selected from the group consisting of tin, copper, silver, bismuth, antimony, indium and zinc. In the case of using the solder material as conductive substance 20, the light-emitting element 24 and the electrodes 16 are electrically connected to each other by being thermocompression bonded at a temperature equal to or higher than the melting point of the solder material present therebetween.

The average particle diameter of the conductive particles and the solder material (the conductive substance 20) is not particularly limited as long as the flip-chip mounting (mainly the electrical conduction) of the light-emitting element 24 to the support 12 may be achieved. The average particle diameter can be 1 µm to 50 µm, and preferably 3 µm to 20 µm. In this specification, the average particle diameter does not include the length of pointed ends of the conductive substance 20 described later.

Figure 2:
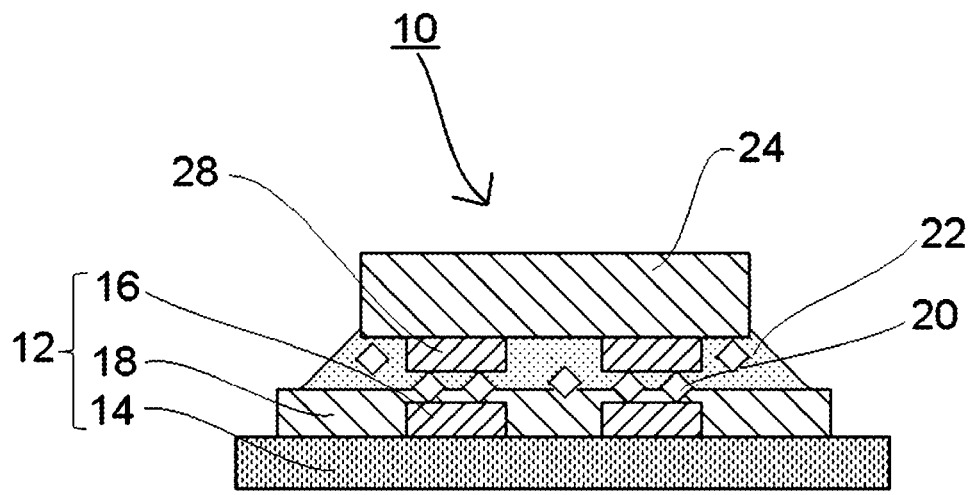
FIG. 2 is a schematic view illustrating a cross section of light-emitting device according to the second embodiment.

A light-emitting device 10 can be manufactured by the ESC method, as illustrated in FIG. 2 (second embodiment). In this embodiment, an insulating reflective member 18 is disposed onto a substrate 14 having a pair of electrodes 16 on its upper surface to cover the entirety of the electrodes 16; further, on the reflective member 18, a resin member 22 is applied to cover the entirety of the region corresponding to the electrodes 16; and a pair of pad electrodes of a light-emitting element 24 (the pad electrodes being disposed on the surface of the light-emitting element 24 opposed to the substrate 14) are soldered to the electrodes 16 via metal films 28 (bumps) and a solder material 20 in the resin member 22, thereby establishing an electrical connection.

In case where the conductive particles are used as the conductive substance 20, the electrodes 16 and the pad electrodes (more specifically, the metal films 28) may be connected (bonded) to each other with the similar configuration.

The metal films (bumps) 28 may be formed on the electrodes 16 of the support 12 or may be formed on the pad electrodes of the light-emitting element 24. By forming the metal films 28 on the surface of the pad electrodes, it is possible to prevent the pad electrodes from being damaged (during, for example, compression bonding) by the conductive substance 20, particularly conductive substance 20 with pointed ends described later, in the resin member 22.

The thickness of the metal films 28 is advantageously larger than the difference between the average particle diameter of the conductive substance 20 and the thickness of the reflective member 18. It is possible to effectively prevent damages to the pad electrodes on the light-emitting element 24 and damages to the light-emitting element 24 itself by the conductive substance 20 to ensure the conduction between the light-emitting element 24 and the pair of electrodes 16.

By disposing the conductive substance 20 (the conductive particles and/or the solder material) described above in an appropriate amount, the light-emitting element 24 and the pair of electrodes 16 may be electrically connected to each other with high reliability without the occurrence of problems such as short circuits between the electrodes 16.

During the manufacturing of the light-emitting device 10, the resin member 22 which contains the conductive substance 20 and is in liquid form is applied on the reflective member 18 so that the resin member 22 will cover at least the lower surface of the light-emitting element 24 (the surface opposed to the substrate 14), and thereafter the light-emitting element 24 is compressed to the resin member 22. In this process, the conductive substance 20 in the resin member 22 not only is brought into contact with the electrodes of the light-emitting element 24 by the compression bonding, but also is caused to cut and penetrate through the reflective member 18 by the pressure of the compression bonding and is consequently placed in contact with the electrodes 16 of the support 12. A vibration may be applied during the compression bonding to facilitate for the conductive substance 20 to penetrate through the reflective member 18.

Figure 3:
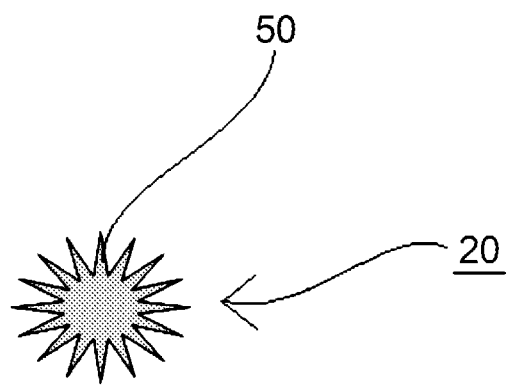
FIG. 3 is a schematic view illustrating a conductive substance having pointed ends.

For example, as schematically illustrated in FIG. 3, the conductive substance 20 preferably has pointed ends 50 to attain the ability to cut and penetrate through the reflective member 18 easily. The pointed ends 50 may be present locally on the conductive substance 20 or, as illustrated in FIG. 3, may be present over the entirety of the conductive substance 20. Specifically, the shape of the conductive substance 20 having the pointed ends 50 is, for example, a shape with horns, projections or thorns, or is a cornered shape.

In case where the conductive substance 20 has a resin core such as the aforementioned metal-coated resin particles, it is preferable that the core have higher flexibility than the surrounding members such as the reflective member 18 and the resin member 22 and the hardness of the pointed ends 50 be higher than the hardness of the reflective member 18 and the resin member 22. With this configuration, the conductive substance 20 may penetrate through the reflective member 18 more effectively.

The conductive substance 20 (the conductive particles and/or the solder material) having such pointed ends 50 may be produced by, for example, forming pointed ends 50 on spherical particles by a plating method or crushing spherical particles so as to generate pointed ends 50.

In case where the conductive substance 20 is the solder material, the pointed ends 50 may be lost by the heat applied during the mounting of the light-emitting element 24 or the mounting of the light-emitting device 10.

In the light-emitting device 10, the resin member 22 discussed above is located on the lower surface (and the side surface) of the light-emitting element 24. Thus, the light extraction efficiency of the light-emitting device 10 may be enhanced by imparting light-reflecting properties to this member. To impart light-reflecting properties to the resin member 22, for example, a light-reflective filler may be added. To prevent undesired electrical conduction, the filler needs to be insulating. Known such fillers may be used without limitation, with examples including light-reflective acicular insulating particles such as zinc oxide whiskers, titanium oxide whiskers, potassium titanate whiskers, titanic acid whiskers, aluminum borate whiskers and wollastonite (kaolin silicate acicular crystals), and light-reflective spherical insulating particles such as titanium oxide, boron nitride, zinc oxide and aluminum oxide. By the addition of these light-reflective and insulating fillers, the optical reflectance of the resin member 22 may be increased to 70% to 98%.

In the present embodiment (first embodiment), the reflective member 18 is disposed under the light-emitting element 24 and under the resin member 22. Therefore, enhanced light extraction efficiency may be obtained even in the absence of a light-reflective filler in the resin member 22.

Further, as mentioned earlier, the light-emitting device of the present embodiment is configured such that the resin member 22 is disposed at least between the light-emitting element 24 and the substrate 14 and the reflective member 18 is disposed at least over the an entirety of a surface that is located immediately below the resin member 22. With this configuration, the thickness of the resin member 22 may be reduced.

<Light-Emitting Element 24>

In this embodiment, as mentioned hereinabove, the light-emitting element 24 is flip-chip mounted on the pair of electrodes 16 of the support 12, and is electrically connected to the pair of electrodes 16 on the substrate 14 via the conductive substance 20 in the resin member 22. The configuration of the light-emitting element 24 is not particularly limited, and various known configurations may be adopted as long as the flip-chip mounting is feasible.

Figure 4:
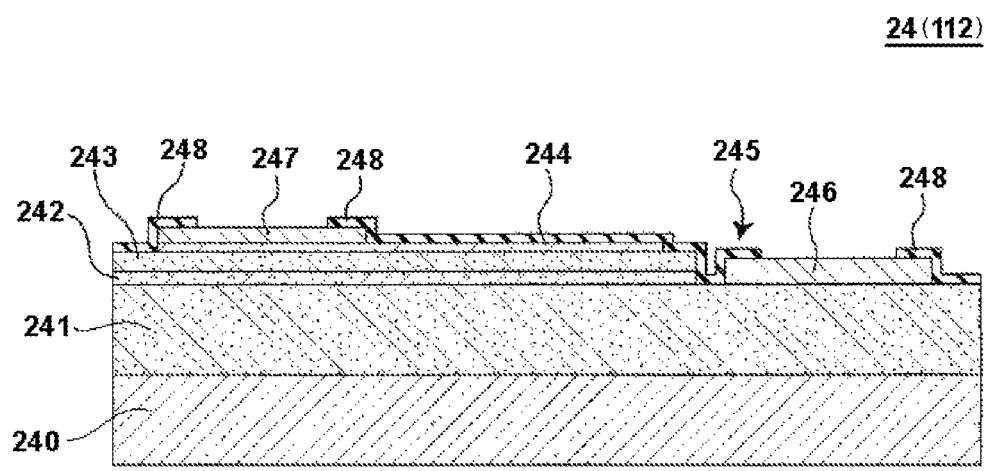
FIG. 4 is a schematic view illustrating a cross section of an example of light-emitting element that can be used for the light emitting device according to embodiments.

An example of the configurations of the light-emitting element is illustrated in FIG. 4. FIG. 4 is a cross sectional, vertically-flipped view of the light-emitting element 24 shown in FIG. 1. For example, as illustrated in FIG. 4, an n-type nitride semiconductor layer 241, an active layer 242 and a p-type nitride semiconductor layer 243 are stacked in this order on a support substrate 240. Further, a p-side electrode is disposed on the p-type nitride semiconductor layer 243. This electrode may be configured such that a full-surface electrode 244 made of a material such as ITO, Al or Ag is disposed on the p-type nitride semiconductor layer 243 to distribute the current over the entirety of the p-type nitride semiconductor layer 243, and further a p-side pad electrode 247 is disposed on the full-surface electrode 244.

In the light-emitting element 24 of the present embodiment, the n-type nitride semiconductor layer 241 is exposed on an exposed surface 245, and an n-side electrode 246 is disposed on the exposed n-type nitride semiconductor layer 241. The n-side electrode 246 may be a stack of an n-side contact electrode and an n-side pad electrode.

Portions of the p-side electrode and the n-side electrode are covered with an insulating film 248 for the purpose of protection and to prevent short circuits between these electrodes.

The p-side electrode and the n-side electrode are each electrically connected to the pair of electrodes 16 of the substrate 14 via the resin member 22. When the positive and negative electrodes 16 on the substrate are sufficiently separated from each other, short circuits may be prevented even without forming the insulating film 248 because the main component forming the resin member 22 (except for the conductive substance 20) has insulating properties.

Flip-chip mounting is carried out such that the p-side electrode and the n-side electrode of the light-emitting element 24 discussed above are opposed to the substrate 14. The positions of the flip-chip mounting of the light-emitting element 24 correspond to the pair of electrodes 16 of the substrate 14. Referring to the embodiment illustrated in FIG. 1, the light-emitting element 24 is mounted in such a manner that the light-emitting element 24 straddles the space between the pair of electrodes 16, the p-side electrode and the n-side electrode of the light-emitting element 24 are aligned to the respective positions of the pair of electrodes 16 of the substrate 14, and the light-emitting element 24 is mounted. In the light-emitting element shown in FIG. 4, the p-side electrode and the n-side electrode have different heights. In this case, it is preferable that the thicknesses of the pair of electrodes 16 be varied or a level change be provided on the substrate 14 so as to correspond to the difference in height so that the upper surface (the light extraction surface) of the light-emitting element 24 will be parallel to a horizontal plane. More preferably, the height of the n-side electrode 246 is leveled to the height of the p-side pad electrode 247 to ensure that the upper surface of the light-emitting element 24 will be parallel to a horizontal plane.

The respective configurations of the layers in the light-emitting element 24 described above may be any of various known configurations without limitation. For example, the n-type nitride semiconductor layer 241 may be a GaN contact layer or an InGaN/GaN multilayer structure, and the p-type nitride semiconductor layer 243 may be a GaN contact layer, an AlGaN, InGaN or GaN single layer or a multilayer structure including any of these layers. Insulating or semi-insulating regions or layers, or regions or layers having the opposite conductivity type may be disposed in portions of the respective layers.

For example, the active layer 242 in the light-emitting element 24 has a quantum well structure including a well layer made of $Al_aIn_bGa_{1-a-b}N$ ($0 \le a \le 1$, $0 \le b \le 1$, and $a+b \le 1$) and a barrier layer made of $Al_cIn_dGa_{1-c-d}N$ ($0 \le c \le 1$, $0 \le d \le 1$, and $c+d \le 1$). The wavelength of the light emitted from the active layer is approximately 360 nm to 650 nm, and preferably 380 nm to 560 nm in accordance with factors such as the purpose and the application of the light-emitting element.

The light-emitting element 24 may have a reflective film such as a dielectric multilayer film or a reflective film made of a metal or the like having high optical reflectance such as Ag or Al, on its lower surface, namely, the surface opposed to the substrate 14. With such a reflective film, the downward light emitted from the active layer 242 of the light-emitting element 24 may be reflected and thus the light extraction efficiency of the light-emitting device 10 may be enhanced. In particular, in case where the resin member 22 does not contain a light-reflective filler, it is preferable that the reflective film be disposed over as large an area as possible on the lower surface of the light-emitting element 24 to ensure that the downward light emitted from the active layer 242 will be reflected in an upward direction.

The light-emitting device 10 of the first embodiment may include a plurality of light-emitting elements 24.

<Light-Transmissive Resin 30>

Figure 5:
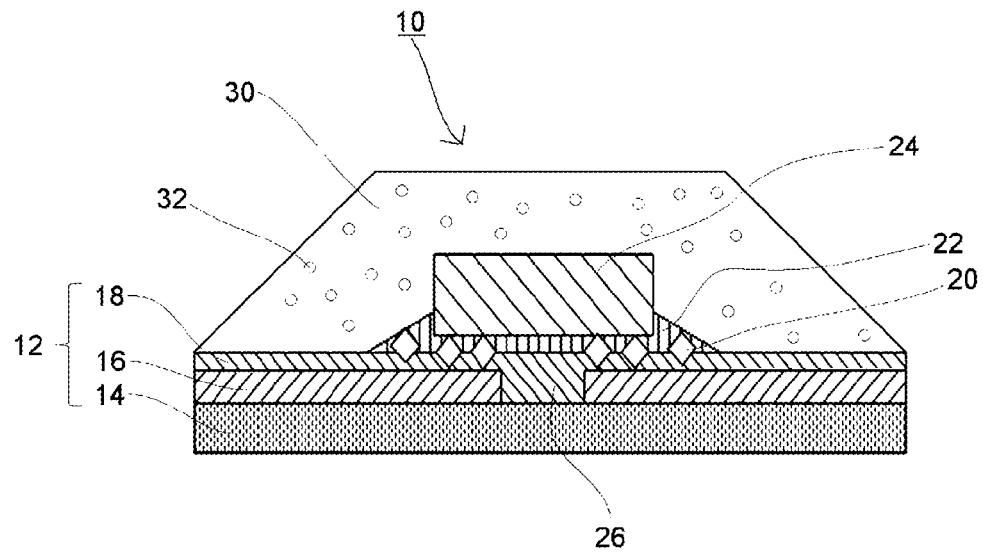
FIG. 5 is a schematic view illustrating a cross section of the light-emitting device having a resin sealing according to the first embodiment.

As illustrated in FIG. 5, the light-emitting device of the first embodiment is preferably in the form of a package in which a light-transmissive resin 30 is disposed to seal the upper side of the light-emitting device 10, namely, the exposed surfaces of the resin member 22, the support 12 and the light-emitting element 24 on the upper side of the light-emitting device 10 in the direction of their stacking.

The sealing may protect the members of the light-emitting device 10 from impacts such as physical shock. In the first embodiment, the resin member 22 is preferably formed in a small thickness to reduce the height of a fillet that is formed on the side surface of the light-emitting element 24. Thus, the strength with which the fillet fixes the light-emitting element 24 (the bond strength) may be low in some cases. It is therefore preferable to add bond strength by such sealing.

In particular, in case where a flexible configuration is adopted using a flexible substrate as the substrate 14, the seal may advantageously compensate for the decrease in bending strength due to the reduction of the fillet height and thus may increase the resistance of the light-emitting device 10 to various external stresses.

Preferred examples of the light-transmissive resins 30 for use in such resin sealing include silicone resins and modified silicone resins having high light transmission properties. Further, light-transmissive insulating resins such as epoxy resins, modified epoxy resins and acrylic resins may be used. Furthermore, use may be made of weather-resistant resins such as urea resins, fluororesins and hybrid resins including at least two kinds of these resins.

(Wavelength-Converting Material 32)

The light-emitting device 10 may include a wavelength-converting material 32 which absorbs at least part of the light emitted from the light-emitting element 24 and converts the wavelength thereof. For example, the wavelength-converting material 32 may be contained in the light-transmissive resin 30. Typically, the wavelength-converting material 32 is a phosphor that is excited by the emitted light to produce fluorescence. By the use of the wavelength-converting material 32, the light from the light-emitting element 24 as a light source may be converted into light with a different wavelength. That is, the use of the wavelength-converting material 32 makes it possible to obtain mixed light of the light from the light-emitting element 24 and the different wavelength light converted by the wavelength-converting material 32. As the wavelength-converting material 32, the use of phosphors is preferable because phosphors have light-scattering and light-reflecting functions and can serve as light scatterers in addition to converting the wavelength, thus making it possible to enhance the light extraction efficiency. The phosphor may be mixed in a substantially uniform concentration in the light-transmissive resin 30 or may be concentrated locally. For example, the phosphor may be distributed such that the concentration is higher in the vicinity of the light-emitting element 24.

For example, white mixed light may be produced by using a light-emitting element 24 emitting blue light in combination with an yttrium aluminum garnet phosphor (YAG phosphor) as the wavelength-converting material 32. In the manufacturing of white light-emitting devices, the concentration of the YAG phosphor in the light-transmissive resin 30 is controlled so that white light will be produced. In this case, for example, the concentration of the YAG phosphor is about 5 to 50%.

The YAG phosphor is a generic name for phosphors which have a garnet structure including yttrium and aluminum. Specifically, the phosphors are activated with at least one element selected from the rare earth elements, and produce a fluorescence by being excited by the blue light emitted from the light-emitting element 24. The phosphors having a garnet structure which may be used are not limited to the YAG phosphors, and it is possible to use, for example, those phosphors having a compositional formula such as $(Re_{1-x}Sm_x)_3(Al_{1-y}Ga_y)_5O_{12}:Ce$ ($0 \leq x < 1$, $0 \leq y \leq 1$, and Re is at least one element selected from Y, Gd, La and Lu).

Nitride phosphors may be also used as the phosphors. Specific examples of the nitride phosphors include those represented by the general formula: $L_xM_yN_{(2/3)X+(4/3)Y}:R$ or $L_xM_yO_ZN_{(2/3)X+(4/3)Y-(2/3)Z}:R$ (L is at least one Group II element selected from the group consisting of Be, Mg, Ca, Sr, Ba and Zn, M is at least one Group IV element selected from the group consisting of C, Si, Ge, Sn, Ti, Zr and Hf, R is at least one rare earth element selected from the group consisting of Y, La, Ce, Pr, Nd, Sm, Eu, Gd, Tb, Dy, Ho, Er and Lu, and X, Y and Z satisfy $0.5 \leq X \leq 3$, $1.5 \leq Y \leq 8$, and $0 < Z \leq 3$).

Phosphors which produce red light by absorbing blue light may be used, with examples including KSF phosphors.

A single kind of a phosphor, or two or more kinds of phosphors may be present in the single layer of the light-transmissive resin 30. In this manner, a light-emitting device 10 that emits a desired wavelength may be realized.

<Connector and Zener Diode>

The light-emitting device 10 may have a connector to establish a connection to an external power supply unit. A Zener diode may be used to increase the electrostatic discharge resistance of the light-emitting device 10.

(Additional Materials)

The light-transmissive resin 30 may contain appropriate materials such as thickening agents, pigments and light-scattering materials in addition to the wavelength-converting material 32 in accordance with the use application. By the use of such additional materials, a light-emitting device 10 having good directional characteristics may be obtained. The light-transmissive resin 30 may contain various coloring agents as filter materials having a filtering effect to block external light or undesired wavelength light from the light-emitting element 24.

As the light-scattering materials, for example, particles having a median particle size of 1 nm to less than 5 μm may be used. Such light-scattering materials can favorably diffuse and reflect the light from the light-emitting element 24 and the wavelength-converting material 32 and thus can reduce the unevenness of the color caused by the wavelength-converting material 32 having large particle diameters.

Light-scattering materials with a median particle size of 5 μm to 100 μm may be suitably used as fillers. The addition of fillers having such particle sizes to the light-transmissive resin 30 provides a light scattering effect to reduce the dispersion in chromaticity of the light-emitting device 10 and also results in an increase in thermal shock resistance of the light-emitting device 10. Consequently, it becomes possible to prevent the occurrence of cracks and separation at the interface between the light-emitting element 24 and the adjacent members even during use at high temperatures.

As the thickening agents, powders having a median particle size of 1 nm to less than 1 μm may be suitably used. Such powders can increase the resin viscosity of the light-transmissive resin 30 without causing a decrease in luminosity.

<Light-Emitting Device Manufacturing Process>

The light-emitting device of the first embodiment may be manufactured by any process without limitation as long as the aforementioned configuration of the light-emitting device may be realized. For example, the light-emitting device may be manufactured as described below. For reference, the reference signs used in FIGS. 1, 2 and 5 will be used for the equivalent features.

First, a support 12 is provided which includes a substrate 14, a pair of electrodes 16 and a reflective member 18. Specifically, for example, a pair of electrodes 16 is formed first on a substrate 14, and subsequently a reflective member 18 is formed on the substrate 14 and/or the electrodes 16. As already mentioned, the number of the electrodes 16 may be three or more as required.

The electrodes 16 may be formed by a known method such as deposition, sputtering, plating, a build-up method or a subtractive method using a photoresist, metal foil lamination, or a printing method using a conductive paste. In case where the electrodes 16 are lead frames, the substrate 14 may be formed by a molding method such as injection molding or transfer molding. In terms of cost, the thickness of the electrodes 16 is preferably small because the subsequent formation of the reflective member 18 is facilitated and is feasible in particular by a simple method such as coating or printing.

The reflective member 18 may be formed in consideration of the subsequent steps in which an area is determined where a light-emitting element 24 will be flip-chip mounted on the electrodes 16 and a resin member 22 is formed on the determined area so that the resin member 22 will be interposed between the light-emitting element 24 and the substrate 14 (for example, the resin member 22 will cover the lower surface of the light-emitting element 24). Specifically, the reflective member 18 is formed such that the reflective member is disposed at least over an entirety of a surface that is located immediately below the resin member 22. In the case where an opening or a gap 26 is present between the electrodes 16 such as when the pair of electrodes 16 is a pair of spaced apart metal wirings, the reflective member 18 is preferably disposed in this region too. In the case of a white resist or a white resin, the reflective member 18 may be formed by a known method such as mask printing, spin coating, application or spray coating.

While the support 12 may be fabricated in the above manner, the provision of the support 12 is not limited to producing the support 12 as described above and may include other approaches such as purchasing a support 12.

Subsequently, a resin member 22 is applied on an area which is such that after the formation of the resin member 22, the reflective member 18 will be present over an entirety of a surface that is located immediately below the resin member 22 (in other words, this area is at least a portion of the reflective member 18). The resin member 22 may be formed by a method such as dispensing or printing. As mentioned hereinabove, the resin member 22 contains conductive particles and/or a solder material as a conductive substance 20. A light-emitting element 24 and the electrodes 16 of the support 12 can be electrically connected to each other by using conductive substance 20 and metal films 28 of a conductive material such as gold or solder disposed on the electrodes 16 of the support 12 or on pad electrodes of the light-emitting element 24.

Further, a light-emitting element 24 is placed onto the resin member 22. Here, positioning is performed such that metal films 28 disposed on pad electrodes of the light-emitting element 24 will be opposed to the pair of electrodes 16 of the support 12. Thereafter, the light-emitting element 24 is pressed at an elevated temperature to cause the conductive particles and/or the solder material 20 in the resin member 22 to cut and penetrate through the reflective member 18 and to be in contact with both the metal films 28 and the electrodes 16. In this manner, the light-emitting element 24 and the support 12 are electrically connected to each other and are also physically bonded to each other. Because the reflective member 18 is preferably disposed to fill the gap 26 defined by the substrate 14 and the electrodes 16 on the substrate 14, strong bonding between the light-emitting element 24 and the support 12 may be achieved without use of an underfill material.

A vibration or the like is preferably applied simultaneously with the pressing and the heating. In this manner, the reflective member 18 may be easily penetrated by the conductive substance 20 or by pointed ends 50 of the conductive substance 20.

The pressure and the heat applied during the above step sometimes cause deformation, more specifically, thickness reduction of the reflective member 18. In this case, the penetration of the reflective member 18 by the conductive substance 20 and the bonding may be accomplished easily.

By the filling of the gap 26 with the reflective member 18 described above, it is possible to reduce the thickness of the resin member 22 and consequently to suppress sufficiently the occurrence of a fillet due to the wetting phenomenon during the heating and pressing of the light-emitting element 24. The suppression of the fillet formation suppresses the absorption of light emitted through the side surface of the light-emitting element 24, thus enhancing the light extraction efficiency of the light-emitting device 10.

Further, the resin member 22 is disposed between the light-emitting element 24 and the substrate 14, and the reflective member 18 is disposed over an entirety of a surface that is located immediately below the resin member 22 or over an area larger than the resin member 22. With this configuration, the downward light emitted from the light-emitting element 24 may be favorably reflected and thus the adverse effect of the fillet on the light extraction efficiency may be reduced.

A process for manufacturing the light-emitting element 24 may be briefly described as follows.

First, an n-type nitride semiconductor layer, an active layer, and a p-type nitride semiconductor layer are formed by crystal growth on a growth substrate and an n-side electrode and a p-side electrode are formed on the semiconductor layers to produce, for example, a structure illustrated in FIG. 4.

The light-emitting element 24 may be a semiconductor stack composed of these layers or may have additional layers (such as the aforementioned reflective film). The growth substrate may be any substrate which allows nitride semiconductors (in particular, GaN semiconductors) to be epitaxially grown therefrom. The configuration of the growth substrate such as the size and the thickness is not particularly limited. Examples of the growth substrates include insulating substrates such as sapphire and spinel ($MgAl_2O_4$) having a C-plane, an R-plane or an A-plane as the principal plane, as well as silicon carbides (6H, 4H, 3C), ZnS, ZnO, Si and GaAs. Nitride semiconductor substrates such as GaN and MN may be also used. Because the light-emitting element is flip-chip mounted in the first embodiment, it is preferable that the growth substrate be a light-transmissive substrate such as sapphire or SiC. The growth substrate may be removed after, for example, the mounting of the light-emitting element.

After the mounting of the light-emitting element 24, the structure is sealed with a light-transmissive resin 30 as required, thereby obtaining a light-emitting device 10 in the form of a package. The sealing method may be conventional without limitation. A wavelength-converting material 32 and other additional materials may be added to the light-transmissive resin 30.

Next, the configuration such as the structure of the light-emitting devices of the second aspect will be described based on third and fourth embodiments. The following <1> to <9> are specific examples of the light-emitting devices of the second aspect that will become apparent from the embodiments described hereinbelow.

<1> A light-emitting device including:

a support including a substrate, a pair of electrodes, and a reflective member disposed on the substrate, the pair of electrodes being disposed on the substrate, a light-emitting element flip-chip mounted onto the pair of electrodes, and an anisotropic conductive member disposed between the electrodes and the light-emitting element so as to be in contact with the light-emitting element and to cover at least portions of the electrodes, the reflective member having a higher optical reflectance than the anisotropic conductive member and being disposed to surround the light-emitting element while being spaced apart from the light-emitting element, the average height of the anisotropic conductive member at between the reflective member and the light-emitting element being not more than the height of the reflective member.

<2> The light-emitting device described in <1>, wherein the anisotropic conductive member has a fillet disposed to cover at least a portion of a side surface of the light-emitting element, and the height of the fillet at its peak top is not more than the height of the reflective member.

<3> The light-emitting device described in <1> or <2>, wherein the electrodes are a pair of metal wirings spaced apart from each other, and the anisotropic conductive member is disposed to fill a region including an area below the surface of the light-emitting element on the substrate side which area is a gap defined by the pair of spaced apart metal wirings and a portion of the substrate between the spaced apart metal wirings, and to fill regions including areas between each of the metal wirings and the surface of the light-emitting element on the substrate side.

<4> The light-emitting device described in any of <1> to <3>, wherein the height of the reflective member is below the height of an upper surface of the light-emitting element.

<5> The light-emitting device described in any of <1> to <4>, wherein the anisotropic conductive member contains a light-reflective and insulating filler.

<6> The light-emitting device described in <5>, wherein the anisotropic conductive member has an optical reflectance of 50% to 98%.

<7> The light-emitting device described in any of <1> to <6>, wherein the light-emitting element has a reflective film on the surface on the substrate side.

<8> The light-emitting device described in any of <1> to <7>, further including a light-transmissive resin sealing the substrate, the pair of electrodes, the anisotropic conductive member, the reflective member and the light-emitting element.

<9> The light-emitting device described in <8>, wherein the light-transmissive resin contains a wavelength-converting material or a light-scattering material.

According to the third and fourth embodiments, the light-emitting device achieves good light extraction efficiency by suppressing the influence of light absorption by conductive particles present in a fillet formed during the manufacturing process of the light-emitting device.

[Light-Emitting Device]

Figure 6:
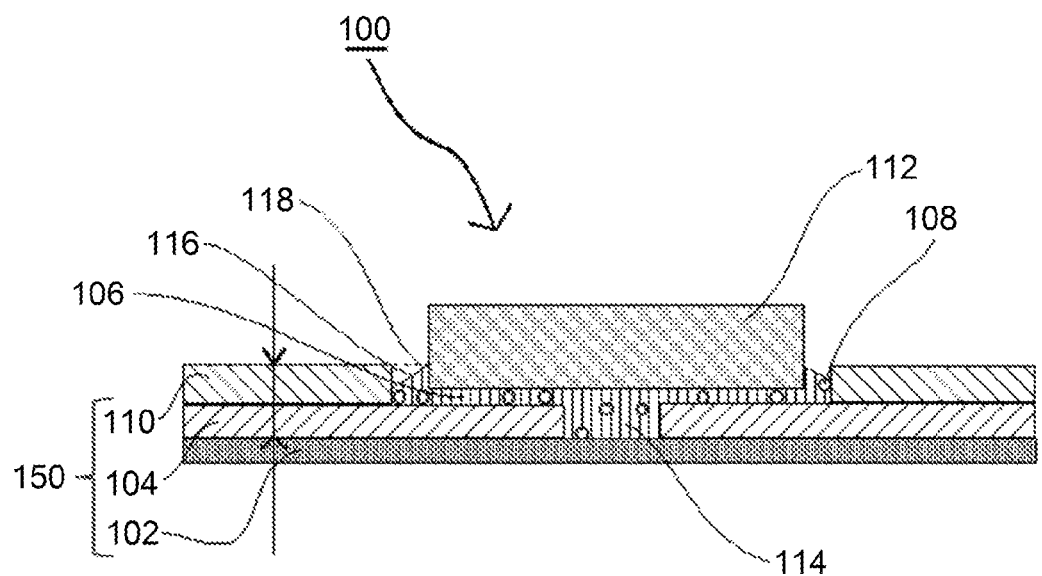
FIG. 6 is a schematic view illustrating a cross section of a light-emitting device according to the third embodiment.

FIG. 6 is a schematic view illustrating a cross section of the light-emitting devices according to the third embodiment. Hereinbelow, a light-emitting device 100 according to the embodiment will be described with reference to FIG. 6.

<Support 150>

The light-emitting device 100 of the present embodiment includes a support 150 which includes a substrate 102, a pair of electrodes 104 disposed on the substrate 102, and a reflective member 110 disposed on the substrate 102. The substrate 102 is substantially the same as the substrate 14 in the light-emitting device 10 of the first embodiment, and may be formed using any of the appropriate known materials described with respect to the substrate 14. The substrate 102 may be a flexible substrate formed of a specific material described hereinabove.

Further, similarly to the substrate 14 of the first embodiment, a material with a high optical reflectance may be added to the material used to form the substrate 102. The thickness of the substrate 102 may be substantially the same as the substrate 14 of the first embodiment. Further, the shape of the substrate 102 in a top view of the light-emitting device 100 of the present embodiment may be the same as that of the substrate 14.

<Electrodes 104>

A pair of electrodes 104 is disposed on the upper surface of the substrate 102. A light-emitting element 112 will be flip-chip mounted on the electrodes 104. The substrate 102 has at least a pair of electrodes 104, and may have three or more electrodes as required.

The configuration such as the shape, the materials and the thickness of the electrodes 104 in the present embodiment may be the same as that of the electrodes 16 in the light-emitting device 10 of the first embodiment.

<Anisotropic Conductive Member 106>

In the light-emitting device 100 of the present embodiment, a light-emitting element 112 is flip-chip mounted on the pair of electrodes 104. An anisotropic conductive member 106 is responsible for bonding and electrical conduction between the electrodes 104 and the light-emitting element 112. Specifically, the anisotropic conductive member 106 is disposed between the electrodes 104 and the light-emitting element 112. More specifically, the anisotropic conductive member 106 is in contact with the light-emitting element 112, covers at least portions of the electrodes 104, in particular, regions of the electrodes 104 below the light-emitting element 112, and strongly bonds the electrodes 104 and the light-emitting element 112 to each other. Of the anisotropic conductive member 106, an exposed portion that extends from a lower part of the light-emitting element 112 in an outward direction will be written as the exposed portion 116.

The anisotropic conductive member 106 contains a conductive substance 108. The conductive substance 108 is caught between the electrodes 104 and the light-emitting element 112 to be in contact with these components. Consequently, the electrodes 104 are electrically connected to the light-emitting element 112 via the conductive substance 108. The conductive substance 108 may be substantially the same as the conductive substance 20 in the light-emitting device 10 of the first embodiment. The conductive substance 108 is present in the anisotropic conductive member 106 in such a prescribed amount that short circuits will not occur between the electrodes 104. Similarly to the resin member 22 in the first embodiment, the anisotropic conductive member 106 may contain a light-reflective and insulating filler. In this case, the optical reflectance of the anisotropic conductive member 106 can be 50% to 98%.

Figure 7:
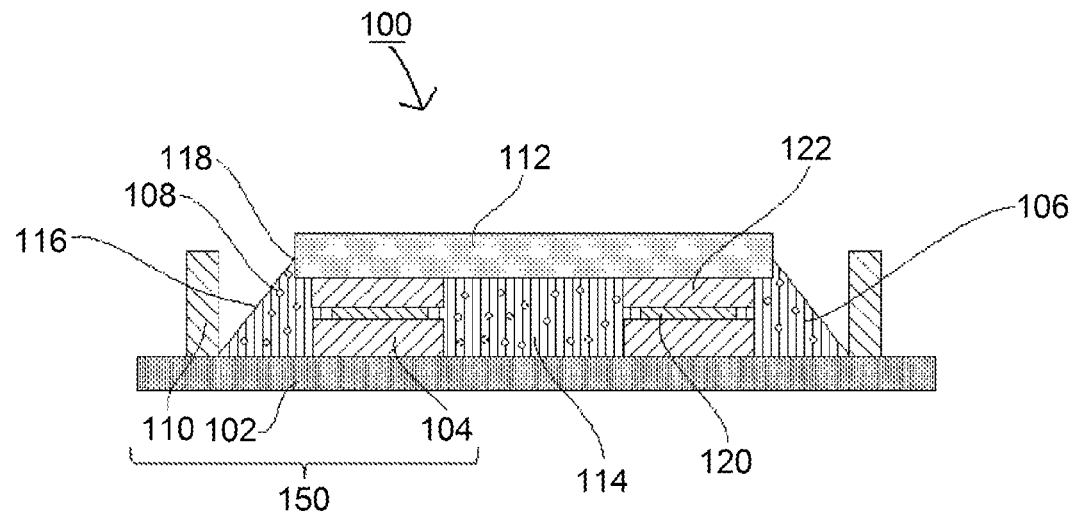
FIG. 7 is a schematic view illustrating a cross section of a light-emitting device according to the fourth embodiment.

A light-emitting device 100 can be manufactured by the ESC method, as illustrated in FIG. 7 (fourth embodiment). In this embodiment, an anisotropic conductive member 106 is applied onto a substrate 102 having a pair of electrodes 104 on its upper surface so as to cover the entirety of the electrodes 104; and light-emitting element-side electrodes 122 of a light-emitting element 112 are soldered to the electrodes 104 optionally via bumps, thereby establishing an electrical connection. These steps result in solder joints 120.

In the light-emitting device 100 of the embodiment illustrated in FIG. 6, the electrodes 104 are a pair of spaced apart metal wirings stacked on the substrate 102. A gap 114 is defined by these metal wirings and the substrate 102 (more specifically, by the pair of spaced apart metal wirings and a portion of the substrate between the spaced apart metal wirings). In the gap, the substrate 102 is exposed to the light-emitting element 112. To ensure that this exposed portion of the substrate 102 is satisfactorily bonded to the light-emitting element 112, the anisotropic conductive member 106 is disposed to fill not only regions including areas between the metal wirings and the light-emitting element 112, more specifically, regions including areas between the metal wirings and the surface of the light-emitting element 112 on the substrate 102 side, but also a region including the gap 114 below the surface of the light-emitting element 112 on the substrate 102 side.

As described above, the anisotropic conductive member 106 is involved in the bonding and the electrical connection between the substrate 102 and the electrodes 104, and the light-emitting element 112. In the manufacturing of a light-emitting device 100, for example, electrodes 104 are stacked onto a substrate 102, an anisotropic conductive member 106 is applied onto at least portions of the electrodes 104 (in particular, portions corresponding to the lower surface of a light-emitting element 112) and into a gap 114, and a light-emitting element 112 is placed on the member 106. During this process, at least a portion of the anisotropic conductive member 106 under the light-emitting element 112 is squeezed out and moves upward on the side surface of the light-emitting element 112 by exhibiting wetting properties, thus forming a fillet covering at least a portion of the side surface.

If the conductive substance 108 is present in the fillet, the light emitted from the light-emitting element 112 may be absorbed by the conductive substance in the fillet. It is difficult to prevent a decrease in light extraction efficiency by providing a light-reflecting layer at such a location. In the present embodiment (third embodiment), the decrease in light extraction efficiency caused by the fillet is remedied by controlling the height of the fillet and by providing a reflective member 110 with a specific configuration described later.

<Light-Emitting Element 112>

In present embodiment, as mentioned hereinabove, a light-emitting element 112 is flip-chip mounted on the pair of electrodes 104 on the substrate 102, and is electrically connected to the electrodes 104 via the conductive substance 108 in the anisotropic conductive member 106. The configuration of the light-emitting element 112 is not particularly limited, and various known configurations may be adopted as long as the flip-chip mounting is feasible. An example of the configurations is the same as the example of the light-emitting element 24 discussed with respect to the light-emitting device 10 of the first embodiment. Similarly to the first embodiment, the light-emitting device 100 of the present embodiment may include a plurality of light-emitting elements 112.

<Reflective Member 110>

To enhance the light extraction efficiency of the light-emitting device 100, the present embodiment is configured such that a reflective member 110 is disposed on the substrate 102 so as to surround the light-emitting element 112 while being spaced apart from the light-emitting element 112 (see, for example, FIG. 6). The reflective member 110 has a higher optical reflectance than the anisotropic conductive member 106 and is disposed on the substrate 102 so as to surround the light-emitting element 112 while being spaced apart from the side surface of the light-emitting element 112. The average height of the anisotropic conductive member 106 at between the reflective member 110 and the light-emitting element 112 (namely, at an exposed portion 116) is controlled to be not more than the height of the reflective member 110. In the present embodiment, the term "height of the reflective member 110" indicates the height of the upper surface of the reflective member 110.

That is, in the present embodiment, the height of the upper surface of the reflective member 110, namely, the length of the line segment sandwiched between the upward and downward arrows near the left electrode 104 in FIG. 6 is equal to or greater than the average height of the exposed portion 116 of the anisotropic conductive member 106. In other words, the average height over the entirety of the exposed portion 116 is at the same level as or is below the dotted line in FIG. 6 drawn above the exposed portion 116 (the dotted line drawn between the reflective member 110 on the left side and the light-emitting element 112). With the height controlled in this manner, the reflective member 110 can reflect the light from the light-emitting element 112 including portions of light whose intensity has been weakened by the absorption by the fillet, thereby enhancing the light extraction efficiency.

In a preferred embodiment of the present embodiment, the height of the fillet at its peak top 118 in contact with the light-emitting element 112 is not more than the height of the reflective member 110. With this configuration, the absorption of light by the fillet may be suppressed to the minimum.

FIG. 6 illustrates the portion of the anisotropic conductive member 106 as being highest on the light-emitting element 112 side and as being lowest on the reflective member 110 side. However, the profile is not necessarily limited to this embodiment and may be such that the anisotropic conductive member 106 has the lowest portion anywhere between the reflective member 110 and the light-emitting element 112 (the anisotropic conductive member 106 can have a substantially concave cross section). Further, a portion of the anisotropic conductive member 106 may extend onto an edge portion of the reflective member 110. In this case, the shape of the reflective member 110 is not flat as illustrated in FIG. 6 but is such that the reflective member 110 has an elevated portion higher than the anisotropic conductive member 106 disposed on the edge portion of the reflective member and also such that the height of the highest portion of the reflective member 110 from the upper surface of the substrate 102 is equal to or greater than the average height of the exposed portion 116 (including the portion of the anisotropic conductive member 106 disposed on the edge portion of the reflective member 110) from the upper surface of the substrate 102.

Further, it is preferable that the height of the reflective member 110 be below the height of the upper surface of the light-emitting element 112. By adjusting the height of the reflective member 110 in this manner, the light emitting angle of the light-emitting device 100 of the present embodiment may be further increased.

In the case where the height of the reflective member 110 differs from place to place for reasons such as the thickness of the reflective member 110 being nonuniform or the presence of irregularities on the electrodes 104 or the substrate 102 disposed under the reflective member 110, the height of the reflective member 110 is defined as the height of a certain region of the reflective member 110 which exerts a large influence on the light emission of the light-emitting element 112, specifically, as the average height of a certain region of the reflective member 110 which surrounds the light-emitting element 112.

In case where a gap 114 is present as illustrated in FIG. 6, the amount of the anisotropic conductive member 106 in the gap is larger than on the other regions. Consequently, the side surface of the light-emitting element 112 that is located above the gap 114 will receive a larger (deeper) fillet than in the other portions. In the present embodiment, the average height of the anisotropic conductive member 106 at between the reflective member 110 and the light-emitting element 112 (the average height of the exposed portion 116) is defined as the average height of the exposed portion 116 as viewed in the cross section illustrated in FIG. 6. That is, the height measured at the large fillet that is possibly present in the region described above is ignored in the determination of the average height. The cross section in FIG. 6 is a cross section taken along A-A in FIG. 8 (a top view illustrating a configuration of the light-emitting device 100 of the present embodiment), namely, a cross section in a direction perpendicular to the direction in which the gap 114 extends.

Similarly in the case of the embodiment illustrated in FIG. 7, a relatively larger fillet will be present on the side surface of the light-emitting element 112 located above the gap 114, but the average height of the exposed portion 116 in this embodiment is defined as the average height of the exposed portion 116 as viewed in the cross section illustrated in FIG. 7.

Figure 8:
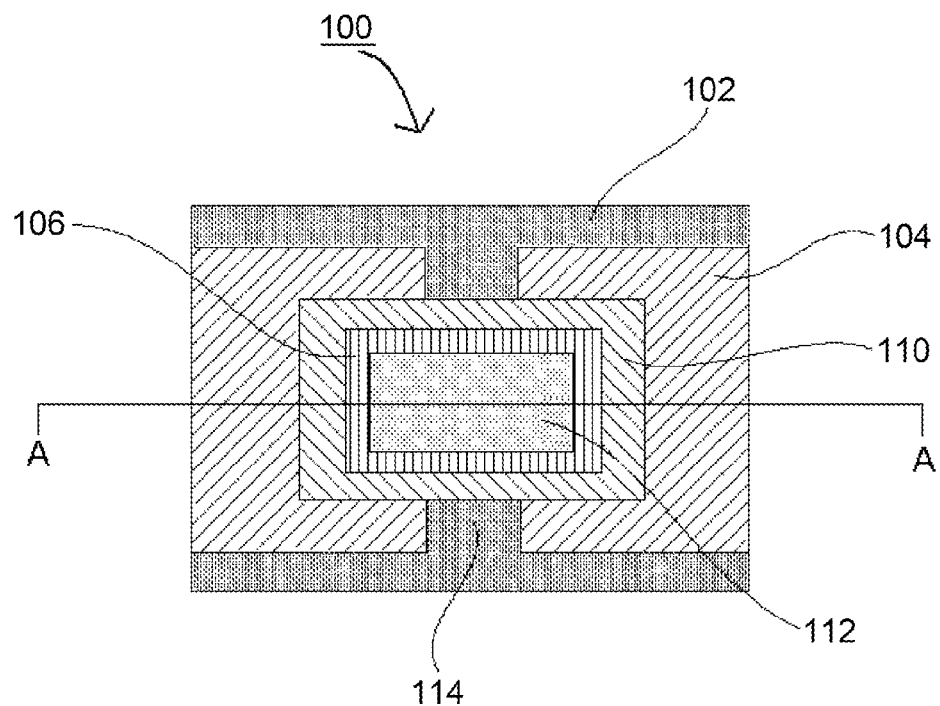
FIG. 8 is a schematic top view illustrating the light-emitting device according to the third embodiment.

The reflective member 110 is formed to surround a light-emitting element 112. To enhance the light extraction efficiency, it is preferable that the light-emitting device 100 has the following configuration. At the mounting-scheduled region of the light-emitting element 112, the electrodes 104 and the substrate 102 are partially exposed. The exposed portions thereof make an opening region. It is preferable that the light-emitting element 112 will be accommodated in the center of the region. In a top view of the light-emitting device 100, the shape of the reflective member 110 disposed to surround the light-emitting element 112 is not particularly limited. While FIG. 8 illustrates the shape as being a rectangular frame, other shapes such as square frames and circular frames may be used. The reflective member 110 may be disposed to cover substantially the entire surface on the light-emitting element 112 side of the light-emitting device 100.

While the reflective member 110 is disposed on the electrodes 104 in FIG. 6, it is also preferable that the reflective member 110 be disposed on a portion of the substrate 102 as illustrated in FIG. 7.

The materials for making the reflective member 110 discussed above are similar to those for the reflective member 18 in the light-emitting device 10 of the first embodiment.

<Light-Transmissive Resin 124>

Figure 9:
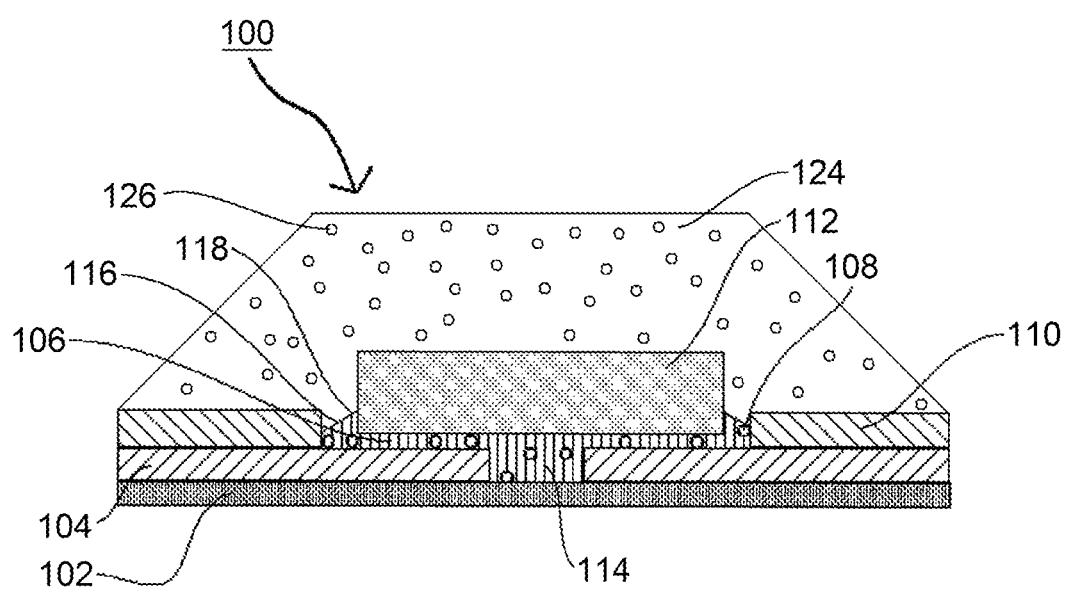
FIG. 9 is a schematic view illustrating a cross section of the light-emitting device having a light-transmissive resin according to the third embodiment.

FIG. 9 is a schematic view illustrating an embodiment of the light-emitting devices 100 of the third embodiment. The light-emitting device 100 in the illustrated embodiment of the third embodiment is in the form of a package in which a light-transmissive resin 124 is disposed to seal the upper side of the light-emitting device 100, namely, the substrate 102, the electrodes 104, the anisotropic conductive member 106, the reflective member 110 and the light-emitting element 112 in the light-emitting device 100.

The effect and the configuration such as the materials for the light-transmissive resin 124 may be the same as those of the light-transmissive resin 30 in the light-emitting device 10 of the first embodiment.

<Wavelength-Converting Material>

The light-emitting device 100 may include a wavelength-converting material 126 which absorbs at least part of the light emitted from the light-emitting element 112 and converts the wavelength thereof. The effect and the configuration such as the materials for the wavelength-converting material 126 may be the same as those of the wavelength-converting material 32 in the light-emitting device 10 of the first embodiment.

<Other Configurations>

Similarly to the light-emitting device 10 of the first embodiment, the light-emitting device 100 of the third embodiment may have a connector to establish a connection to an external power supply unit. A Zener diode may be used to increase the electrostatic discharge resistance of the light-emitting device 100.

Similarly to the case of the light-emitting device 10 of the first embodiment, the light-transmissive resin 124 in the light-emitting device 100 of the present embodiment may contain other materials such as thickening agents, pigments, light-scattering materials and various coloring agents as filter materials.

<Light-Emitting Device Manufacturing Process>

The light-emitting device of the third embodiment may be manufactured by any process without limitation as long as the aforementioned configuration of the light-emitting device may be realized. For example, the light-emitting device of the third embodiment may be manufactured as described below. For reference, the reference signs used in FIG. 6 will be used for the equivalent features.

First, a support 150 is provided which includes a substrate 102, a pair of electrodes 104 and a reflective member 110. For example, a pair of electrodes 104 is formed first on a substrate 102. As already mentioned, the number of the electrodes 104 may be three or more as required. The electrodes 104 may be formed by the same method as in the first embodiment.

Subsequently, a reflective member 110 is formed on the substrate 102 and/or the electrodes 104. The reflective member 110 is formed in such a manner that a position is determined beforehand in which the flip-chip mounting of a light-emitting element 112 on the electrodes 104 will take place, and the reflective member 110 is formed so as to surround the flip-chip mounting-scheduled region while being spaced apart from the region. Consequently, an area (an opening) is defined in which the electrodes 104 and the substrate 102 are exposed for the mounting of the light-emitting element 112. In the case where the reflective member 110 is a white thermosetting resin, the reflective member 110 may be formed by a known method such as application or printing.

Next, an anisotropic conductive member 106 is applied to at least a portion of the region where the light-emitting element 112 will be mounted, namely, at least a portion of the opening. The anisotropic conductive member 106 may be applied by a known method such as dispensing or printing. As mentioned hereinabove, the anisotropic conductive member 106 contains conductive particles or a solder material as a conductive substance 108. A light-emitting element 112 and the electrodes 104 of the substrate 102 are connected to each other by the conductive substance 108 and bumps of a conductive material such as gold or solder deposited on the electrodes 104 of the substrate 102 or on light-emitting element-side electrodes of the light-emitting element 112.

Further, a light-emitting element 112 is placed onto the anisotropic conductive member 106. Here, positioning is performed such that electrodes on the light-emitting element 112 will be opposed to the electrodes 104 on the substrate 102. Thereafter, the light-emitting element 112 is mounted by the application of pressure and heat similarly to the case in the first embodiment. In this manner, strong bonding between the light-emitting element 112 and the substrate 102 may be achieved without use of an underfill material.

During the above process, the anisotropic conductive member 106 moves upward on the side surface of the light-emitting element 112 due to wetting phenomenon, thus forming a fillet covering at least a portion of the side surface. This fillet may absorb the light emitted from the light-emitting element 112. As mentioned hereinabove, the light-emitting device 100 of the third embodiment has the reflective member 110 disposed with the specific height which ensures that the light extraction efficiency can be enhanced. The specific height of the reflective member 110 may be realized by dispensing the anisotropic conductive member 106 in a small amount or by printing the anisotropic conductive member 106 using a thin printing plate.

A process for manufacturing the light-emitting element 112 may be as described in the first embodiment.

After the mounting of the light-emitting element 112, the structure may be sealed with a light-transmissive resin 124 as required, thereby obtaining a light-emitting device 100 in the form of a package.

REFERENCE SIGNS LIST

10 LIGHT-EMITTING DEVICE
12 SUPPORT
14 SUBSTRATE
16 ELECTRODE
18 REFLECTIVE MEMBER
20 CONDUCTIVE SUBSTANCE (CONDUCTIVE PARTICLES AND/OR SOLDER MATERIAL)
22 RESIN MEMBER
24 LIGHT-EMITTING ELEMENT
26 GAP
28 METAL FILM (BUMP)
30 LIGHT-TRANSMISSIVE RESIN
32 WAVELENGTH-CONVERTING MATERIAL
50 POINTED END
100 LIGHT-EMITTING DEVICE
102 SUBSTRATE
104 ELECTRODE
106 ANISOTROPIC CONDUCTIVE MEMBER
108 CONDUCTIVE SUBSTANCE
110 REFLECTIVE MEMBER
112 LIGHT-EMITTING ELEMENT
114 GAP
116 EXPOSED PORTION
118 PEAK TOP OF FILLET
120 SOLDER JOINT
122 LIGHT-EMITTING ELEMENT-SIDE ELECTRODE
124 LIGHT-TRANSMISSIVE RESIN
126 WAVELENGTH-CONVERTING MATERIAL
150 SUPPORT
240 SUPPORT SUBSTRATE
241 N-TYPE NITRIDE SEMICONDUCTOR LAYER
242 ACTIVE LAYER
243 P-TYPE NITRIDE SEMICONDUCTOR LAYER
244 FULL-SURFACE ELECTRODE
245 EXPOSED SURFACE
246 N-SIDE ELECTRODE
247 P-SIDE PAD ELECTRODE
248 INSULATING FILM

What is claimed is:

1. A light-emitting device comprising:
a support including a substrate, a pair of electrodes, and an insulating reflective member, the pair of electrodes being disposed on an upper surface of the substrate, and the reflective member being disposed on the substrate;
a light-emitting element flip-chip mounted on the pair of electrodes; and
a resin member disposed at least between the light-emitting element and the reflective member, the resin member comprising a plurality of conductive particles dispersed in an insulating resin,
wherein the reflective member is disposed at least over an entirety of a surface that is located immediately below the resin member, and
wherein at least some of the conductive particles are electrically connecting particles, which electrically connect the light-emitting device to the pair of electrodes,
wherein the electrically connecting particles penetrate the reflective member, such that a first portion of each electrically connecting particle is located in the resin member, and a second portion of each electrically connecting particle is located in the reflective member, and
wherein the light-emitting element includes a top surface, a bottom surface, and a plurality of lateral surfaces, and wherein the top surface and at least portions of the lateral surfaces of the light-emitting element are exposed from the resin member.

2. The light-emitting device according to claim 1, wherein the conductive particles have pointed ends that penetrate the reflective member.

3. The light-emitting device according to claim 1, wherein the pair of electrodes comprises spaced apart metal wirings disposed on the substrate.

4. The light-emitting device according to claim 1,
wherein the light-emitting element comprises a pair of pad electrodes on a surface of the light-emitting element that is opposed to the substrate,
wherein a metal film is disposed on each of the pair of pad electrodes of the light emitting element, and
wherein the electrically connecting particles electrically connect the pair of pad electrodes to the pair of electrodes via the metal films.

5. The light-emitting device according to claim 4,
wherein a thickness of the metal films is larger than a difference between an average particle diameter of the conductive particles and a thickness of the reflective member.

6. The light-emitting device according to claim 1, wherein the resin member contains a light-reflective and insulating filler.

7. The light-emitting device according to claim 6, wherein the resin member has an optical reflectance of 70% to 98%.

8. The light-emitting device according to claim 1, further comprising a light-transmissive resin disposed to seal exposed surfaces of the resin member, the support and the light-emitting element on the upper side in the direction of their stacking.

9. The light-emitting device according to claim 4, further comprising a light-transmissive resin disposed to seal exposed surfaces of the resin member, the support and the light-emitting element on the upper side in the direction of their stacking.

10. The light-emitting device according to claim 8, wherein the light-transmissive resin contains a wavelength-converting material.

11. The light-emitting device according to claim 6, further comprising a light-transmissive resin disposed to seal exposed surfaces of the resin member, the support and the light-emitting element on the upper side in the direction of their stacking.

12. The light-emitting device according to claim 11, wherein the light-transmissive resin contains a wavelength-converting material.

13. The light-emitting device according to claim 6,
wherein the light-emitting element comprises a pair of pad electrodes on a surface of the light-emitting element that is opposed to the substrate,
wherein a metal film is disposed on each of the pair of pad electrodes of the light emitting element, and wherein the electrically connecting particles electrically connect the pair of pad electrodes to the pair of electrodes via the metal films.

14. The light-emitting device according to claim 1, wherein the reflective member is made of a material that has a higher optical reflectance than that of the resin member.

15. The light-emitting device according to claim 14, wherein the reflective member is made of a white resin or a white resist.

16. The light-emitting device according to claim 14, wherein the reflective member is made of a mixture of a light-transmissive resin and a light-reflecting material.

17. The light-emitting device according to claim 16, wherein the light-transmissive resin is an epoxy resin or a silicone resin, and the light-reflecting material is at least one material selected from the group consisting of titanium oxide, zinc oxide, silicon oxide, and/or zirconium oxide.

18. A process for manufacturing a light-emitting device, the process comprising:
    a step of providing a support including a substrate, a pair of electrodes and an insulating reflective member, the pair of electrodes being disposed on an upper surface of the substrate, and the reflective member being disposed on the substrate;
    a step of applying a resin member on the reflective member, the resin member comprising a plurality of conductive particles dispersed in an insulating resin; and
    a step of placing a light-emitting element onto the resin member and applying pressure to the light-emitting element to flip-chip mount the light-emitting element onto the pair of electrodes,
    wherein the resin member is disposed at least between the light-emitting element and the reflective member,
    wherein the reflective member is disposed at least over an entirety of a surface that is located immediately below the resin member,
    wherein at least some of the conductive particles are electrically connecting particles, which electrically connect the light-emitting device to the pair of electrodes
    wherein the electrically connecting particles penetrate the reflective member, such that a first portion of each electrically connecting particle is located in the resin member, and a second portion of each electrically connecting particle is located in the reflective member, and
    wherein the light-emitting element includes a top surface, a bottom surface, and a plurality of lateral surfaces, and wherein the top surface and at least portions of the lateral surfaces of the light-emitting element are exposed from the resin member.

19. The process for manufacturing a light-emitting device according to claim 18, wherein the conductive particles have pointed ends that penetrate the reflective member.

* * * * *